US006492093B2

(12) United States Patent
Gaschler et al.

(10) Patent No.: US 6,492,093 B2
(45) **Date of Patent: *Dec. 10, 2002**

(54) RADIATION-SENSITIVE MIXTURES COMPRISING IR-ABSORBING CYANINE DYES HAVING A BETAINE STRUCTURE OR HAVING A BETAINE STRUCTURE AND CONTAINING AN ANION, AND RECORDING MATERIALS PREPARED THEREWITH

(75) Inventors: Otfried Gaschler, Wiesbaden (DE); Andreas Elsaesser, Idstein (DE); Joerg Jung, Floersheim (DE); Hans-Joachim Schlosser, Wiesbaden (DE)

(73) Assignee: Agfa-Gevaert AG, Leverkusen (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/362,857

(22) Filed: Jul. 29, 1999

(65) Prior Publication Data

US 2002/0006575 A1 Jan. 17, 2002

(30) Foreign Application Priority Data

Aug. 1, 1998 (DE) ........................................ 198 34 746

(51) Int. Cl.[7] ........................... G03C 1/77; G03C 1/73; G03F 7/038; G03F 7/30

(52) U.S. Cl. ............................... 430/271.1; 430/270.1; 430/273.1; 430/278.1; 430/270.2; 430/281.1; 430/905; 430/302; 430/944; 430/926

(58) Field of Search .......................... 430/270.1, 270.2, 430/944, 905, 906, 910, 926, 271.1, 273.1, 278.1, 302, 306, 281.1; 544/299, 300

(56) References Cited

U.S. PATENT DOCUMENTS

| | | | | |
|---|---|---|---|---|
| 4,264,692 A | * | 4/1981 | Held | 430/302 |
| 5,093,492 A | | 3/1992 | Acker et al. | 430/270.1 |
| 5,641,608 A | * | 6/1997 | Grunwald et al. | 430/302 |
| 6,235,451 B1 | * | 5/2001 | Damme et al. | 430/302 |

FOREIGN PATENT DOCUMENTS

| | | |
|---|---|---|
| DE | 1 447 963 | 11/1968 |
| DE | 97 39 302.0 | 3/1999 |
| EP | 0 290 916 | 11/1988 |
| EP | 0 556 690 | 8/1993 |
| EP | 0 784 233 | 7/1997 |
| EP | 0 823 327 | 2/1998 |
| EP | 0 908 307 | 4/1999 |
| GB | 1154749 | 6/1969 |
| WO | 96/20429 | 7/1996 |
| WO | 97/39894 | 10/1997 |

* cited by examiner

*Primary Examiner*—Janet Baxter
*Assistant Examiner*—Sin J. Lee
(74) *Attorney, Agent, or Firm*—Foley & Lardner

(57) ABSTRACT

The invention relates to a positive-working, radiation-sensitive mixture which contains an organic polymeric binder which is insoluble in water but soluble or at least swellable in aqueous alkaline solution and at least one IR-absorbing cyanine dye having a betaine structure or having a betaine structure and containing an anion and having the formula (I)

(I)

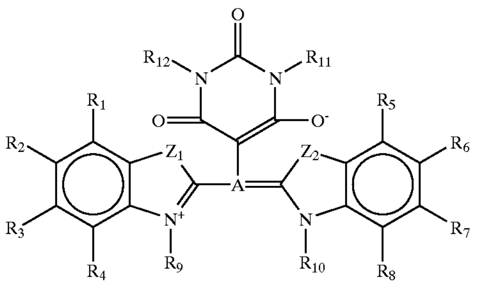

in which $R^1$ to $R^8$ independently of one another, are a hydrogen or halogen atom, a sulfonate, carboxylate, phosphonate, hydroxyl, $(C_1-C_4)$alkoxy, nitro, amino, $(C_1-C_4)$alkylamino, di$(C_1-C_4)$alkylamino group or a $(C_6-C_{10})$aryl group which in turn may be substituted by one or more halogen atoms and/or one or more sulfonate, carboxylate, phosphonate, hydroxyl, $(C_1-C_4)$alkoxy, nitro, amino, $(C_1-C_4)$alkylamino and/or di$(C_1-C_4)$alkylamnino groups, $R^9$ and $R^{10}$ independently of one another, are a straight-chain or branched $(C_1-C_6)$alkyl, a $(C_7-C_6)$aralkyl or a $(C_6-C_{10})$aryl group, each of which in turn may be substituted by one or more halogen atoms and/or one or more sulfonate, carboxylate, phosphonate, hydroxyl, $(C_1-C_4)$alkoxy, nitro, amino, $(C_1-C_4)$alkylamino and/or di$(C_1-C_4)$alkylamino groups, $R^{11}$ and $R^{12}$ independently of one another, are $(C_1-C_4)$alkyl or $(C_6-C_{10})$aryl groups which in turn may be substituted, $Z^1$ and $Z^2$ independently of one another, are a sulfur atom, a di$(C_1-C_4)$alkylmethylene group or an ethene-1,2-diyl group and A is a carbon atom or a chain having conjugated double bonds which results in the formation of a delocalized II-electron system between the quaternary nitrogen atom of the 3H-indolium, quinolinium or benzothiazolium radical and the enolate oxygen atom of the pyrimidine-2,4,6-trione radical.

After imagewise exposure to a laser, the recording material prepared using this mixture can be readily developed with an aqueous alkaline solution without additional processing steps (such as post-bake or postexposure). The invention also relates to a process for the production of printing plates for offset printing from a recording material according to the invention.

17 Claims, No Drawings

RADIATION-SENSITIVE MIXTURES COMPRISING IR-ABSORBING CYANINE DYES HAVING A BETAINE STRUCTURE OR HAVING A BETAINE STRUCTURE AND CONTAINING AN ANION, AND RECORDING MATERIALS PREPARED THEREWITH

BACKGROUND OF THE INVENTION

1. Field of the Invention

The present invention relates to positive-working, radiation-sensitive mixtures which contain an organic, polymeric binder which is insoluble in water but soluble in aqueous alkaline solution and an IR-absorbing dye or pigment. It also relates to recording materials comprising a substrate and a layer of a mixture as described above, as well as to processes for the production of lithographic printing plates. Radiation-sensitive layers of the present invention have photosensitivity in the IR range so that recording materials prepared therewith are suitable, for example, for direct image production by the computer-to-plate (CTP) method.

2. Description of the Related Art

The use of dyes and pigments as IR absorbers in radiation-sensitive mixtures is generally known in the art. For example, the recording material according to WO 96/20429 comprises a layer containing IR-absorbing carbon black pigments, 1,2-naphthoquinone-2-diazidosulfonic esters or -carboxylic esters and a phenolic resin. 1,2-naphthoquinone-2-diazidosulfonic acid or -carboxylic acid can also be esterified directly with the hydroxyl groups of the phenol resin. The layer is first exposed uniformly to UV radiation and then imagewise to IR laser beams. As a result of the action of the IR radiation, specific parts of the layer rendered soluble by the UV radiation become insoluble again. This is therefore a negative-working system. The processing of the material is thus relatively complicated.

EP-A 0 784 233 also describes a negative-working mixture which contains a) novolak and/or polyvinylphenol, b) amino compounds for curing the component a), c) a cyanine and/or polymethine dye which absorbs in the near IR range and d) photochemical acid formers.

The non-prior-published patent application DE 197 39 302 describes a positive-working, IR-sensitive mixture which comprises a binder which is insoluble in water but soluble or at least swellable in aqueous alkali and carbon black particles dispersed therein, the carbon black particles being the radiation-sensitive component important for imagewise differentiation.

WO 97/39894 describes layers which contain dissolution-inhibiting additives. Such additives reduce the solubility of the unexposed parts of the layer on development in aqueous alkaline solutions. The additives are, in particular cationic compounds, especially dyes and cationic IR absorbers, such as quinolinecyanine dyes, benzothiazolecyanine dyes or merocyanines, in addition to various pigments. However, if these layers are heated to 50 to 100° C. for from 5 to 20 seconds, the additives lose their dissolution inhibiting activity.

The positive-working mixture disclosed in EP-A 0 823 327 contains, as IR absorbers, cyanine, polymethine, squarylium, croconium, pyrylium or thiopyrylium dyes. Most of these dyes are cationic and have an inhibiting effect. Moreover, many of them are halogen-containing. Under unfavorable conditions, particularly upon IR irradiation or during baking, environmentally harmful decomposition products can form therefrom. Some dyes containing betaine groups and an anionic dye (compound S-9 on page 7) are also disclosed. After drying of the layer, however, due to its large number of sulfonated groups, the presence of this anionic dye generally causes crystallization or precipitation of components of the layer, leading to substantially poorer properties of the IR-sensitive layer and resulting in a poor appearance of the layer.

The disadvantage of the layer compositions known from the art is that the increase in solubility which is achieved by post-bake is reversible after storage at room temperature. If a printing plate is not further processed immediately after heating (for example, by using a heating oven), the development properties change, which may lead to reproduction problems in the processing of the recording materials. As already mentioned, environmentally harmful decomposition products may even form under unfavorable conditions as a result of halogen-containing cationic additives.

SUMMARY OF THE INVENTION

It was one object of the present invention to provide radiation-sensitive mixtures of the type described at the outset which contain neither diazonium compounds nor heat-curable or acid-curable amino compounds nor any silver halide compounds. Apart from an imagewise exposure and development, it is desirable that mixtures of the present invention generally require no additional operation, such as post-bake or postexposure, which was also an object of the present invention.

These and other objects can be achieved by a positive-working, radiation-sensitive mixture which contains an organic polymeric binder which is insoluble in water but soluble or at least swellable in aqueous alkaline solution and at least one IR-absorbing cyanine dye having a betaine structure or having a betaine structure and containing an anion, the cyanine dye having the formula (I)

(I)

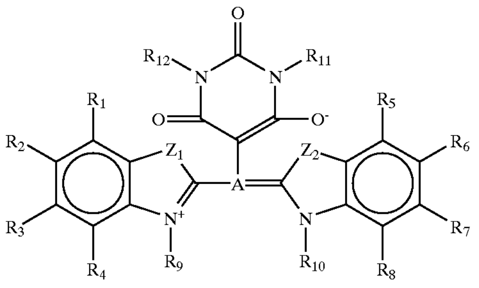

wherein $R^1$ to $R^8$ independently of one another, comprise a hydrogen or halogen atom, a sulfonate, carboxylate, phosphonate, hydroxyl, $(C_1–C_4)$alkoxy, nitro, amino, $(C_1–C_4)$alkylamino, di-$(C_1–C_4)$alkylamino group or a $(C_6–C_{10})$aryl group, which in turn may be substituted by one or more halogen atoms and/or one or more sulfonate, carboxylate, phosphonate, hydroxyl, $(C_1–C_4)$alkoxy, nitro, amino, $(C_1–C_4)$alkylamino and/or di$(C_1–C_4)$alkylamino groups, $R^9$ and $R^{10}$ independently of one another, comprise a straight-chain or branched $(C_1–C_6)$alkyl, a $(C_7–C_6)$ aralkyl or a $(C_6–C_{10})$aryl group, each of which in turn may be substituted by one or more halogen atoms and/or one or more sulfonate, carboxylate, phosphonate, hydroxyl, $(C_1-C_4)$alkoxy, nitro, amino, $(C_1-C_4)$alkylamino and/or di$(C_1-C_4)$alkylamino groups, $R^{11}$ and $R^{12}$ independently of one another, comprise $(C_1-C_4)$alkyl or $(C_6-C_{10})$aryl groups, which in turn may be substituted, $Z^1$ and $Z^2$ independently of one another, comprise a sulfur atom, a di$(C_3-C_4)$alkylmethylene group or an ethene-1,2-diyl group and A comprises a carbon atom or a chain having conjugated double bonds which results in the formation of a delocalized π-electron system between the quaternary nitrogen atom of the 3H-indolium, quinolinium or benzothiazolium radical and the enolate oxygen atom of the pyrimidine-2,4,6-trione radical.

Additional objects, features and advantages of the invention will be set forth in the description which follows, and in part will be obvious from the description, or may be learned by practice of the invention. The objects, features and advantages of the invention may be realized and obtained by means of the instrumentalities and combinations particularly pointed out in the appended claims.

DETAILED DESCRIPTION OF A PREFERRED EMBODIMENT

A chain having the conjugated double bonds is in general 3 to 15 carbon atoms long. A delocalized relectron system in some embodiments usually also extends between the two bicyclic ring systems. Preferred dyes include those having a symmetrical structure, i.e. those in which the (partly) aromatic radicals in the formula (I) are substituted in the same way and in which n=m. They are also generally easier to synthesize.

The $(C_1-C_4)$alkoxy group is preferably a methoxy or ethoxy group, while the $(C_7-C_{16})$aralkyl group is preferably a benzyl group. The halogen atoms are generally chlorine, bromine or iodine atoms. $R^{11}$ and $R^{12}$ are preferably methyl, ethyl, propyl, isopropyl, butyl, isobutyl, sec-butyl, tert-butyl, phenyl or naphth-1-yl or naphth-2-yl groups. The two radicals $R^{11}$ and $R^{12}$ are particularly preferably identical and are also particularly preferably being methyl groups.

The compounds of the formula (I) are referred to as "having a betaine structure" because, in addition to the quaternary nitrogen atom of the 3H-indolium, quinolinium or benzothiazolium ring, they contain the pyrimidine-2,4,6-trione-enolate group shown in the formula. Carboxylate, sulfonate and/or phosphonate groups may also be present, so that the compounds as a whole may contain an anion and have a betaine structure. The number of these anionic groups should in general be not more than 5. The opposite ions of these anionic groups are generally alkali metal or alkaline earth metal cations, especially sodium or potassium ions, in addition to ammonium ions or mono-, di-, tri- or tetraalkylammonium ions. If amino, $(C_1-C_4)$alkylamino or di$(C_1-C_4)$alkylamino groups are present in the cyanine dye of the formula I, the number thereof is preferably less than or at most exactly the same as the number of carboxylate, sulfonate and/or phosphonate groups, so that the dye still has a betaine structure and contains an anion or still has a betaine structure.

Exemplary cyanine dyes having a betaine structure or having a betaine structure containing an anion include those having the following formulae (II) to (IV)

(II)

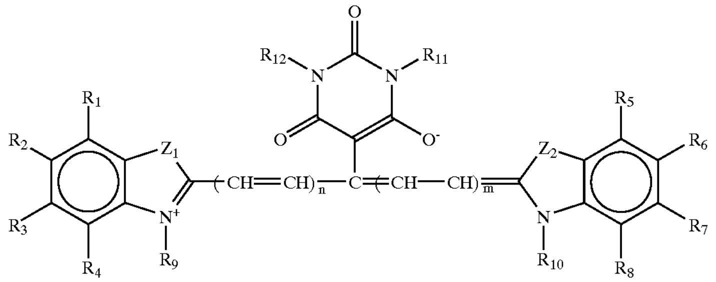

(III)

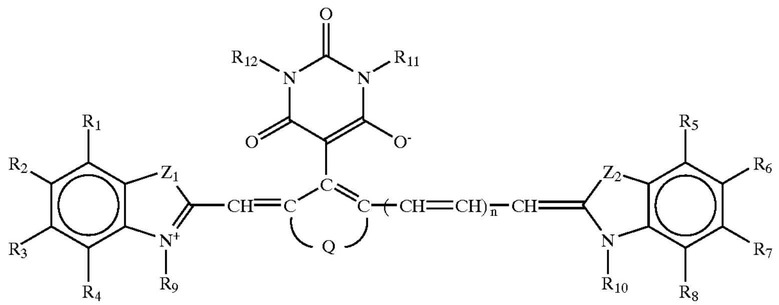

-continued (IV)

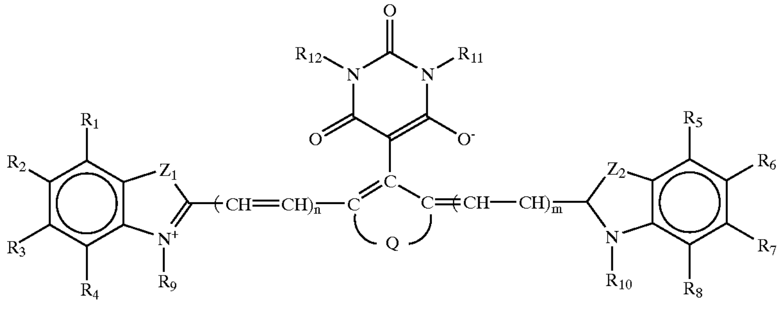

wherein n and m are integers from 1 to 8, with the proviso that n+m=2 or greater, and Q are the members required for the formation of a 4- to 7-membered isocyclic or heterocyclic ring.

The dyes of formulae II–IV are preferable in some embodiments.

The ring formed under inclusion of Q in formula III and IV is preferably a ($C_4$–$C_7$)cycloalkene, particularly preferably cyclopentene. The 4- to 7-membered ring may also be substituted, in particular by halogen atoms, hydroxyl groups, alkoxy groups, nitro groups, amino groups, alkylamino groups, dialkylamino groups, carboxyl groups, sulfo groups or phosphonic acid groups. The heteroatoms include, in particular nitrogen, oxygen and/or sulfur atoms. A plurality of heteroatoms may also occur in the ring.

Finally, in addition to the compounds of the formulae (III) and (IV), structurally isomeric compounds in which the enolate of the pyrimidine-2,4,6-trione is not bonded to the 4- to 7-membered isocyclic or heterocyclic ring but to a carbon atom of the carbon chain linking the two bicyclic radicals are also suitable. Furthermore, dyes in which n=m=1 are particularly preferred in some embodiments.

In mixtures according to the invention, the IR-absorbing cyanine dyes F1 to F3 having a betaine structure or having a betaine structure and containing an anion as shown below (the cationic dye F4* is included for purposes of comparison and is therefore marked with *) are particularly suitable.

F1

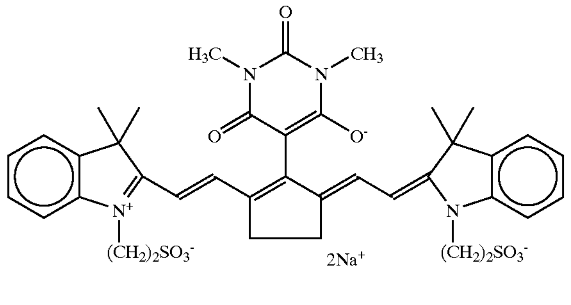

-continued

F2

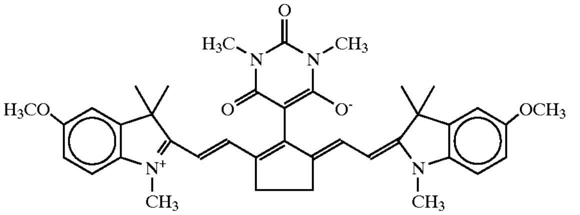

F3

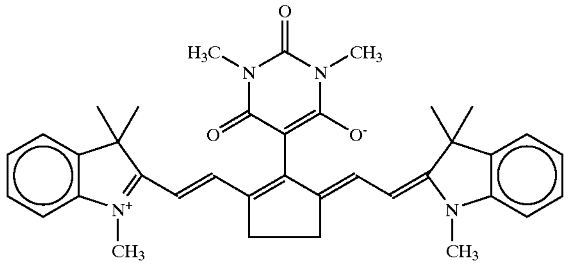

F4*

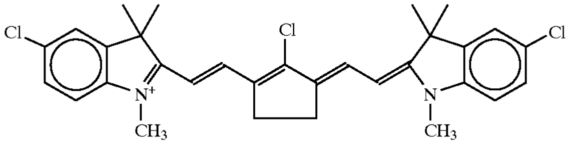

p-toluenesulfonate

Surprisingly, it has been found that the IR-absorbing additives having a betaine structure and containing an anion still have no solubility-inhibiting effect on the layer, but as a rule promote the dissolution or swelling rate when used in aqueous alkaline developers. IR-absorbing additives having a betaine structure can have an inhibiting effect but are relatively inert after a brief post-bake, i.e. they experience no increase in solubility in aqueous alkaline developers.

The amount of the IR-absorbing dye is advantageously from 0.2 to 30% by weight, preferably from 0.5 to 20% by weight, particularly preferably from 0.6 to 10% by weight, based in each case on the total weight of the solids of the mixture. By combining suitable IR-absorbing dyes, it is possible to utilize not only narrow IR ranges but the entire wavelength range of the near IR spectrum (700 to 1,200 nm). At least two IR-absorbing dyes may be required for covering the IR range from 700 to 1200 nm, in particular from 800 to 1100 nm.

Any organic, polymeric binder can be used in the present invention. The organic, polymeric binder is preferably a binder having acidic groups with a $pK_a$ of less than 13. This $pK_a$ helps ensure that the layer is soluble or at least swellable in aqueous alkaline developers. Advantageously, the binder is a polymer or polycondensate, for example a polyester, polyamide, polyurethane or polyurea. Polycondensates and polymers having free phenolic hydroxyl groups, as obtained, for example, by reacting phenol, resorcinol, a cresol, a xylenol or a trimethylphenol with aldehydes—especially formaldehyde—or ketones, are also particularly suitable. Condensates of sulfamoyl- or carbamoyl-substituted aromatics and aldehydes or ketones are also suitable. Polymers of bismethylol-substituted ureas, vinyl ethers, vinyl alcohols, vinyl acetals or vinylamides and polymers of phenylacrylates and copolymers of hydroxylphenylmaleimides are likewise suitable. Furthermore, polymers having units of vinylaromatics, N-aryl(meth)acrylamides or aryl (meth)acrylates may be mentioned, it being possible for each of these units also to have one or more carboxyl groups, phenolic hydroxyl groups, sulfamoyl groups or carbamoyl groups. Specific examples include polymers having units of 2-hydroxyphenyl (meth)acrylate, of N-(4-hydroxyphenyl) (meth)acrylamide, of N-(4-sulfamoylphenyl)-(meth) acrylamide, of N-(4-hydroxy-3,5-dimethylbenzyl)(meth) acrylamide, or 4-hydroxystyrene or of hydroxyphenylmaleimide. The polymers may additionally contain units of other monomers which have no acidic units. Such units include vinylaromatics, methyl (meth)acrylate, phenyl(meth)acrylate, benzyl (meth)acrylate, methacrylamide or acrylonitrile. In this context, the term "(meth) acrylate" represents acrylate and/or methacrylate. The same applies to "(meth)acrylamide", etc.

Any amount of binder can be used. The amount of the binder is advantageously from 40 to 99.8% by weight, preferably from 70 to 99.4% by weight, particularly preferably from 80 to 99% by weight, based in each case on the total weight of the nonvolatile components of the mixture.

In a preferred embodiment, the polycondensate is a novolak, preferably a cresol/formaldehyde or a cresol/xylenol/formaldehyde novolak, the amount of novolak advantageously being at least 50% by weight, preferably at least 80% by weight, based in each case on the total weight of all binders.

Finally, the properties of the mixture according to the invention can also be influenced or controlled, for example, by including finely divided, non-inhibiting, soluble or dispersible dyes which have virtually no absorption in the IR range. Triarylmethane, azine, oxazine, thiazine and xanthene dyes are particularly suitable for this purpose. The amount of any dyes additionally present in the mixture can be any amount desired advantegeously, from 0.01 to 30% by weight, preferably from 0.05 to 10% by weight, based in each case on the total weight of the nonvolatile components of the mixture.

In addition to the components listed above, the mixture may contain further additives which have no layer-inhibiting activity, e.g. carbon black pigments as additional IR absorbers, surfactants (preferably fluorine-containing surfactants or silicone surfactants), polyalkylene oxides for controlling the acidity of the acidic units and low molecular weight compounds having acidic units for increasing the rate of development (e.g. benzoic acid or para-toluenesulfonic acid) However, the mixture generally contains no components which might influence the daylight sensitivity on exposure to radiation in the ultraviolet or visible range of the spectrum.

Binder and IR-absorbing cyanine dye having a betaine structure or having a betaine structure and containing an anion are generally present as a mixture but may also form separate layers. As a result of the separate arrangement of binder and IR-absorbing dyes, higher photosensitivity and better stability to aqueous alkaline developer solutions can often be achieved. In this embodiment, the dye layer is generally above the binder layer. Owing to the hardness of the dye layer, the sensitivity of the surface of the recording material may be simultaneously reduced. In this embodiment, the dye layer preferably comprises one or more of the cyanine dyes having a betaine structure or having a betaine structure and containing an anion. Most preferably only one is included. Non-IR-sensitive dyes are preferably present only if required, and if included, are generally present in the binder layer underneath.

The present invention furthermore relates to recording materials having a substrate and a positive-working, IR-sensitive layer, wherein the layer comprises a mixture as previously described. However, the mixture according to the invention can also be used for other purposes, e.g. as a photoresist. The invention furthermore relates to recording material having a substrate, a layer which predominantly or completely comprises at least one binder and a layer which comprises or consists essentially of at least one of the described IR-absorbing dyes having a betaine structure or having a betaine structure and containing an anion, or a mixture of these dyes with one or more other dyes such as triarylmethane, azine, oxazine, thiazine and/or xanthene dyes (in the layer sequence). The dye layer may also contain particles having a dulling effect, e.g. $SiO_2$ particles or pigments. Additives for improving the uniformity (such as silicone surfactants or fluorine containing surfactants) may likewise be included in minor amounts.

For the preparation of recording material, any known method can be used. For example, the mixture according to the invention can be dissolved in a solvent mixture which does not react irreversibly with the components of the mixture. The solvent should preferably be tailored to the intended coating method, the layer thickness, the composition of the layer and the drying conditions. Suitable solvents include general ketones, such as methyl ethyl ketone (butanone), as well as chlorinated hydrocarbons, such as trichloroethylene or 1,1,1-trichloroethane, alcohols, such as methanol, ethanol or propanol, ethers, such as tetrahydrofuran, glycol-monoalkyl ethers, such as ethylene glycolmonoalkyl ether or propylene glycolmonoalkyl ether and esters, such as butyl acetate or propylene glycolmonoalkyl ether acetate. It is also possible to use a mixture which, for special purposes, may additionally contain solvents such as acetonitrile, dioxane, dimethylacetamide, dimethylsulfoxide or water. For the preparation of a double layer (binder layer+dye layer), the same or different solvents may be used for the two coating processes.

The substrate in the recording material according to the invention can be any desired, and is preferably an aluminum foil or a laminate comprising an aluminum foil and a polyester film. The aluminum surface is preferably roughened, anodized and hydrophilized with a compound which contains at least one phosphonic acid unit or phosphonate unit as well known in the art. A particularly preferred compound which contains phosphonic acid units is polyvinylphosphonic acid. Before the roughening, degreasing and pickling with alkalis and preliminary mechanical and/or chemical roughening may be effected.

A solution of the mixture according to the invention can then be applied to the substrate and dried. Any suitable thickness of the IR-sensitive layer can be formed and the thickness of the IR-sensitive layer is advantageously from 1.0 to 5.0 μm, preferably from 1.5 to 3.0 μm. In the case of the double layer, the thickness of the binder layer is advantageously from 1.0 to 5.0 μm, preferably from 1.5 to 3.0 μm, while the dye layer is generally substantially thinner in comparison and preferably has a thickness of only from 0.01 to 0.3 μm, more preferably from 0.015 to 0.10 μm.

To protect the surface of the recording material, in particular from mechanical action, an overcoat may also optionally be applied. The overcoat generally comprises at least one water-soluble polymeric binder, such as polyvinyl alcohol, polyvinylpyrrolidone, partially hydrolyzed polyvinyl acetates, gelatin, carbohydrates or hydroxyethylcellulose, and can be produced in any known manner such as from an aqueous solution or dispersion which may, if required, contain small amounts, i.e. less than 5% by weight, based on the total weight of the coating solvents for the overcoat, of organic solvents. The thickness of the overcoat can suitably be any amount, advantageously up to 5.0 μm, preferably from 0.1 to 3.0 μm, particularly preferably from 0.15 to 1.0 μm.

Finally, the present invention also relates to processes for the production of a lithographic printing plate, in which the recording material according to the invention is exposed imagewise to infrared radiation and then developed in a conventional aqueous alkaline developer at a temperature of from 20 to 40° C. During development, any water-soluble overcoat present is also removed.

For development, any developers generally customary for positive plates may be used. Silicate-based developers which have a ratio of $SiO_2$ to alkali metal oxide of at least 1 are preferred. This helps to ensure that alumina layer (if present) of the substrate is not damaged. Preferred alkali metal oxides include $Na_2O$ and $K_2O$, and mixtures thereof. In addition to alkali metal silicates, the developer may optionally contain further components, such as buffer substances, complexing agents, antifoams, organic solvents in small amounts, corrosion inhibitors, dyes, surfactants and/or hydrotropic agents as well known in the art.

The development is preferably carried out at temperatures of from 20 to 40° C. in mechanical processing units as customary in the art. For regeneration, alkali metal silicate solutions having alkali metal contents of from 0.6 to 2.0 mol/l can suitably be used. These solutions may have the same silica/alkali metal oxide ratio as the developer (generally, however, it is lower) and likewise optionally contain further additives. The required amounts of regenerated material must be tailored to the developing apparatuses used, daily plate throughputs, image areas, etc. and are in general from 1 to 50 ml per square meter of recording material. The addition can be regulated, for example, by measuring the conductivity as described in EP-A 0 556 690, which is incorporated herein by reference.

The recording material according to the invention can, if required, then be aftertreated with a suitable correcting agent or preservative as known in the art.

To increase the resistance of the finished printing plate and hence to extend the print run, the layer can be briefly heated to elevated temperatures ("baking"). As a result, the resistance of the printing plate to washout agents, correction agents and UV-curable printing inks also increases. Such a thermal aftertreatment is described, inter alia, in DE-A 14 47 963 and GB-A 1 154 749, which are incorporated herein by reference.

The following examples explain in detail the subject of the invention. In the examples, pbw is part(s) by weight. Percentages and amounts are to be understood in weight units, unless stated otherwise, i.e. percentages are to be understood as percentages by weight unless stated otherwise. Comparative compounds or comparative examples are marked with an asterisk (*).

First, the dissolution-inhibiting or dissolution-imparting properties of the IR dyes are determined by determining the rate of removal of the layer before and after imagewise heating in an aqueous alkaline developer as follows:

1. Preparation of the basic formulation.
2. Addition of the additives to be investigated to the basic formulation.
3. Application of the solutions to a suitable substrate so that, after drying, a layer thickness of 1.9±0.1 μm results.
4. Determination of the rate of removal by development in a cell over a period of 30 seconds to 6 min.
5. If the rate of removal is lower than in the case of a simultaneously measured basic formulation, the additive had a dissolution-increasing property and corresponded to the recording material according to the invention.
6. If the additive had an inhibiting effect, a sample was post-baked at from 50 to 160° C. for from 5 to 20 seconds and the rate of removal was determined as described under section 4. A possible loss of layer as a result of the post-bake was taken into account. If the inhibiting effect was maintained in comparison with the basic formulation, this likewise corresponded to the recording material according to the invention.

EXAMPLE 1

A basic formulation was prepared from 1a 4.87 pbw of meta-/ para-cresol/formaldehyde novolak, 20.00 pbw of ethylene glycol monomethyl ether/ butanone (6:4) and 2.00 pbw of distilled water, to which the following dyes as described previously and whose structures are shown supra, were added:

1b* 0.04 pbw of cyanine dye (cationic) F4, 1c 0.04 pbw of cyanine dye (having a betaine structure) F1, 1d 0.04 pbw of cyanine dye (having a betaine structure) F2, 1e 0.04 pbw of cyanine dye (having a betaine structure) F3, 1f* 0.04 pbw of Flexoblau 630, a cationic dye from BASF AG The coating solutions thus prepared were applied to aluminum foils roughened in hydrochloric acid, anodized in sulfuric acid and hydrophilized with polyvinylphosphonic acid. After drying for 2 min at 100° C. the layer thickness was 1.9±0.1 μm.

Determination of the rates of removal without post-bake

The development was carried out in a cell at a temperature of 23° C. with a potassium silicate developer which contained $K_2SiO_3$ (normality 0.8 mol/l in water) and 0.2% of O,O'-biscarboxymethylpolyethylene glycol 1000 and 0.4% of pelargonic acid.

TABLE 1a

| Cell development time [s] | Rates of removal without post-bake [g/m²] | | | | | |
|---|---|---|---|---|---|---|
| [seconds] | 1a* | 1b* | 1c | 1d | 1e | 1f* |
| 30 | 0.02 | 0.01 | 0.11 | 0.09 | 0.06 | 0.05 |
| 60 | 0.11 | 0.05 | 0.12 | 0.10 | 0.13 | 0.07 |
| 120 | 0.34 | 0.23 | 0.25 | 0.24 | 0.27 | 0.18 |
| 240 | 0.59 | 0.43 | 0.67 | 0.59 | 0.61 | 0.60 |
| 360 | 0.96 | 0.61 | 0.85 | 0.84 | 0.85 | 0.81 |

Table 1a shows that Examples 1b to 1e in some embodiments have a solubility-inhibiting effect on the layer, in each case in comparison with a layer without IR dyes (1a*).

Determination of the rates of removal with post-bake

TABLE 1b

| Cell development Time [seconds] | Rate of removal after heating to 50° C. for 20 seconds [g/m²] | | | | |
|---|---|---|---|---|---|
| [s] | 1b* | 1c | 1d | 1e | 1f* |
| 30 | 0.05 | 0.02 | 0.05 | 0.01 | 0.02 |
| 60 | 0.15 | 0.04 | 0.08 | 0.02 | 0.03 |
| 120 | 0.44 | 0.12 | 0.12 | 0.17 | 0.18 |
| 240 | 0.85 | 0.41 | 0.49 | 0.51 | 0.52 |
| 360 | 1.21 | 0.77 | 0.75 | 0.86 | 0.75 |

With post-bakes of 5 sec at 50° C., the rates of removal corresponded to the original rates of removal (without post-bake).

TABLE 1c

| CDT** | Rate of removal after heating to 160° C. for 5 seconds [g/m²] | | | | | Rate of removal after heating to 160° C. for 20 seconds [g/m²] | | | | |
|---|---|---|---|---|---|---|---|---|---|---|
| [s] | 1b* | 1c | 1d | 1e | 1f* | 1b* | 1c | 1d | 1e | 1f* |
| 30 | 0.10 | 0.01 | 0.01 | 0.02 | 0.01 | 0.10 | 0.01 | 0.02 | 0.03 | 0.01 |
| 60 | 0.20 | 0.02 | 0.03 | 0.07 | 0.05 | 0.19 | 0.05 | 0.03 | 0.09 | 0.04 |
| 120 | 0.28 | 0.17 | 0.16 | 0.15 | 0.19 | 0.36 | 0.17 | 0.15 | 0.14 | 0.22 |
| 240 | 0.65 | 0.57 | 0.56 | 0.58 | 0.60 | 0.98 | 0.54 | 0.54 | 0.56 | 0.59 |
| 360 | 1.09 | 0.76 | 0.74 | 0.76 | 0.73 | 1.46 | 0.76 | 0.76 | 0.71 | 0.70 |

CDT** = Cell development time

Tables 1b and 1c clearly show that only Comparative Example 1b*, which contains a cationic IR-absorbing dye, experiences an increase in solubility in an aqueous alkaline solution after a post-bake.

EXAMPLE 2

Coating solutions were prepared from

| | |
|---|---|
| 0.87 pbw | of meta-/para-cresol-formaldehyde novolak, |
| 0.10 pbw | of polyhydroxystyrene, |

-continued

| | |
|---|---|
| 4.50 pbw | of tetrahydrofuran, |
| 1.80 pbw | of ethylene glycol monoalkyl ether, |
| 2.70 pbw | of methanol and |
| 0.03 pbw | of IR absorber (cf. Table 2). |

TABLE 2

| Example | IR-Absorber |
|---|---|
| 2a* | Without absorber |
| 2b* | Carbon black pigment, type HCC from Grolman |
| 2c | F1 |
| 2d | F2 |
| 2e | F3 |

These solutions were applied to aluminum foils roughened in hydrochloric acid, anodized in sulfuric acid and hydrophilized with polyvinylsulfonic acid. After drying for 2 min at 100° C., the layer thickness was 2 μm.

These recording materials were then exposed to infrared radiation in an outer drum exposure unit. A laser having a power of 7.0 W, a write speed of 120 rpm and a beam width of 10 μm was used.

Development was carried out in a conventional automatic developing unit at a throughput speed of 0.8 m/min and a temperature of 23° C., using a potassium silicate developer which contained $K_2SiO_3$ (normality 0.8 mol/l in water) and 0.2% O,O'-biscarboxymethyl polyethylene glycol 1000 and 0.4% of pelargonic acid.

The image reproduction of dots of a test wedge is shown in Table 3.

TABLE 3

| Example | Reproduction of the percent dot area)* | Reproduction of the dot wells |
|---|---|---|
| a* | no development | no development |
| 2b* | 4 | 97 |
| 2c | 3 | 98 |
| 2d | 3 | 99 |
| 2e | 2 | 98 |

TABLE 3-continued

| Example | Reproduction of the percent dot area)* | Reproduction of the dot wells |
|---|---|---|

*The number of steps of a 100 step 60-line test wedge with a dot area percentage of 0 to 100% (increasing in steps of 1%) which were still visible in the case of the respective recording material was determined. "4" means, for example, that the step with 4% dot area was still just visible.

The table shows that the recording materials without IR absorber could not be developed. In the case of the recording material containing carbon black pigment (experiment 2b*), the reproduction of the percent dot areas was substantially poorer and the reproduction of the dot wells, too, was poorer.

EXAMPLE 3

This example shows the stability of recording materials according to the invention to white light compared with layers comprising diazo compounds.

a) A coating solution was prepared from

| | |
|---|---|
| 0.60 pbw | of meta-/para-cresol-formaldehyde novolak, |
| 0.10 pbw | of F2, |
| 6.00 pbw | of tetrahydrofuran and |
| 4.00 pbw | of ethylene glycol monomethyl ether. |

b*) A further coating solution which corresponded to the coating solution according to (a) but additionally contained 0.20 pbw of diazo compound (esterification product of 1 mol of 2,3,4-trihydroxybenzophenone and 1.5 mol of 1,2-naphthoquinone-2-diazido-5-sulfonyl chloride) was prepared.

These solutions were applied to aluminum foils roughened in hydrochloric acid, anodized in sulfuric acid and hydrophilized with polyvinylphosphonic acid. After drying for 2 min at 100° C., the layer was 2 $\mu$m thick.

These recording materials were then exposed to infrared radiation in an outer drum exposure unit. An Nd-YAG laser having a wavelength of 1064 nm and a power of 7.0 W, a write speed of 120 rpm and a beam width of 10 $\mu$m was used (before the IR exposure, the plates were exposed to light for 0 minutes, 1 hour, 1 day or 1 week).

The development was carried out in a conventional automatic developing unit at a throughput speed of 0.8 m/min and a temperature of 23° C., using a potassium silicate developer which contained $K_2SiO_3$ (normality 0.8 mol/l in water) and 0.2% of O,O'-biscarboxymethyl polyethylene glycol 1000 and 0.4% of pelargonic acid.

TABLE 4

| | Development behavior after exposure to daylight | | |
|---|---|---|---|
| Example | 0 min exposure | 1 hour exposure | 1 week exposure |
| 3a | standard | Standard | standard |
| 3b* | standard | total removal of layer | — |

The table shows that the diazo-containing layer was completely removed on development if daylight had acted on the recording material beforehand for 1 hour (or less). In contrast, the recording material according to the invention was insensitive to daylight and could be processed without problems even when it had been exposed to daylight for one week (or more).

EXAMPLE 4

This example shows the advantage of IR dyes with and without indicator dyes in comparison with recording materials sensitized with carbon black, with regard to mechanical surface attack.

Coating solutions were prepared from

| | |
|---|---|
| 0.72 pbw | of meta-/para-cresol/formaldehyde novolak, |
| 0.10 pbw | of a copolymer of (2-hydroxyphenyl) methacrylate and methyl methacrylate (Mw: 4,000) and |
| 0.05 pbw | of 2,4-dihydroxybenzophenone and |
| 0.02 pbw | of Flexoblau 630 from BASF (only in the layers 4b and 4d*) or |
| 0.08 pbw | of F3 (only in the layers 4a and 4b) or |
| 0.04 pbw | of carbon black pigment type HCC from Grolman (only in the layers 4c* and 4d*). |

These solutions were applied to aluminum foils roughened in hydrochloric acid, anodized in sulfuric acid and hydrophilized with polyvinylphosphonic acid. After drying for 2 min at 100° C., the layer was 2 $\mu$m thick.

The recording materials were then exposed to infrared radiation in an outer drum exposure unit. The Nd-YAG laser used in the preceding examples too and having a power of 7.0 W, a write speed of 120 rpm and a beam width of 10 $\mu$m was employed.

Before the development, the recording materials were pretreated in a hardness tester. A rubber wheel having a diameter of about 1 to 2 cm and a contact surface width of about 1 mm rolled over the material to be tested. The contract pressure was set to the values shown in the table with the aid of weights.

The development was carried out in a conventional automatic developing unit at a throughput speed of 0.8 m/min and a temperature of 23° C., using a potassium silicate developer which contained $K_2SiO_3$ (normality 0.8 mol/l in water) and 0.2% O,O'-biscarboxymethyl polyethylene glycol 1000 and 0.4% of pelargonic acid.

Table 5 shows the results of the treatment of the recording materials with the hardness tester. The material exhibits impression marks (referred to as "marks" in the table) depending on the mechanical sensitivity of the coating surface.

TABLE 5

| | Mass acting on a running wheel [N] | | | |
|---|---|---|---|---|
| Example | 0.5 | 1 | 2 | 5 |
| 4a | — | Marks | marks | marks |
| 4b | — | — | — | marks |
| 4c* | marks | Marks | marks | marks |
| 4d* | — | — | Marks | marks |

Recording materials with additional indicator dye are less sensitive to mechanical actions. The table furthermore shows that IR-sensitized recording materials are less sensitive to impression than those pigmented with carbon black.

An aqueous solution of a polyvinyl alcohol (K value 4; residue of acetyl group content 12%) according to EP-A 0 290 916 was then applied to the IR-sensitive layer of the recording material according to Example 4a and was dried. After drying, the thickness of the overcoat thus produced was 0.2 $\mu$m. No impression marks were detectable when the material thus produced (Example 4e) was tested in the manner described.

EXAMPLE 5

Example 5 shows the effect of IR absorber mixtures on recording materials.

A coating solution was prepared from

| | | |
|---|---|---|
| | 0.85 pbw | of meta-/para-cresol/formaldehyde novolak, |
| | 0.06 pbw | of styrene/acrylate copolymer (Mw 6500; acid number 205), |
| | 4.50 pbw | of tetrahydrofuran, |
| | 1.80 pbw | of ethylene glycol monoalkyl ether, |
| | 2.70 pbw | of methanol. |
| a) | 0.04 pbw | of F1 or |
| b) | 0.04 pbw | of F1 and |
| | 0.04 pbw | of carbon black pigment type HCC from Grolman or |
| c) | 0.04 pbw | of carbon black pigment type HCC from Grolman |

were mixed with this solution.

The respective coating solutions were applied to aluminum foils which beforehand had been roughened in hydrochloric acid, anodized in sulfuric acid and hydrophilized with polyvinylphosphonic acid. After drying for 2 min at 100° C., the layer was 2 μm thick.

The recording materials were then exposed to the following laser systems:

a) an outer drum exposure unit; a laser having a wavelength of 830 nm, a power of 5.0 W, a write speed of 120 rpm and a beam width of 10 μm was used, b) an inner drum exposure unit; an Nd-YAG laser having a wavelength of 1064 nm, a power of 8.0 W, a write speed of 367 m/s and a beam width of 10 μm was used.

The development was carried out in a conventional automated development unit at a throughput speed of 1.0 m/min and a temperature of 23° C., using a potassium silicate developer which contained $K_2SiO_3$ (normality 0.8 mol/l in water) and 0.2% of O,O'-biscarboxymethyl polyethylene glycol 1000 and 0.4% of pelargonic acid.

TABLE 7

| Example | Development on exposure to the 830 nm laser | Development on exposure to 1064 nm laser |
|---|---|---|
| 5a | Background just free | cannot be developed |
| 5b | Background free | Background free |
| 5c | Background free | Background free |

The table shows that, by suitable mixing IR absorbers, sensitization in the entire range from 830 nm to 1064 nm is possible.

EXAMPLE 6

A coating solution was prepared from

| | |
|---|---|
| 4.87 pbw | of meta-/para-cresol/formaldehyde novolak |
| 20.00 pbw | of ethylene glycol monomethyl ether and |
| 2.00 pbw | of butanone. |

The solutions were applied to the substrate described in Example 5 and dried (2 min; 100° C.). The layer thickness was then 2 μm.

Solutions of the dye F1 having a betaine structure and containing an anion (Example 6a), of the dye F2 having a betaine structure (Example 6b) or of the dye F3 having a betaine structure (Example 6c) in water/isopropanol (1:1) were then applied to the binder layer thus prepared, and dried so that the layer thickness in each case was 0.02 μm.

As described in the preceding example, the sensitivity of the surface of the recording material to mechanical action was then investigated. In none of the examples 6a to 6c were marks of the running wheel detectable.

The priority document DE 198 34 746.4 filed Aug. 1, 1998 is incorporated herein by reference in its entirety.

As used herein, singular articles such as "a", "an" and "the" can correspond to the singular or plural.

Additional advantages, features and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A recording material comprising:

a substrate, a layer which comprises an organic polymeric binder which is insoluble in water but soluble or at least swellable in aqueous alkaline solution formed over said substrate, and a dye layer, comprising at least one cyanine dye having a betaine structure or having a betaine structure and containing an anion formed over said organic polymeric binder layer, said cyanine dye having the formula (I)

(I)

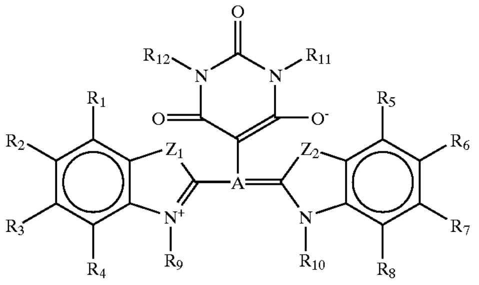

wherein $R^1$ to $R^8$ independently of one another, comprise a hydrogen or halogen atom, a sulfonate, carboxylate, phosphonate, hydroxyl, $(C_1–C_4)$alkoxy, nitro, amino, $(C_1–C_4)$alkylamino, di$(C_1–C_4)$alkylamino group or a $(C_6–C_{10})$aryl group which in turn may be substituted by one or more halogen atoms and/or one or more sulfonate, carboxylate, phosphonate, hydroxyl, $(C_1–C_4)$alkoxy, nitro, amino, $(C_1–C_4)$alkylamino and/or di$(C_1–C_4)$alkylamino groups, $R^9$ and $R^{10}$ independently of one another, comprise a straight-chain or branched $(C_1–C_6)$alkyl, a $(C_7–C_{16})$ aralkyl or a $(C_6–C_{11})$ aryl group, each of which in turn may be substituted by one or more halogen atoms and/or one or more sulfonate, carboxylate, phosphonate, hydroxyl, $(C_1–C_4)$alkoxy, nitro, amino, $(C_1–C_4)$alkylamino and/or di$(C_1–C_4)$ alkylamino groups, $R^{11}$ and $R^{12}$ independently of one another, comprise $(C_1–C_4)$alkyl or $(C_6–C_{10})$aryl groups which in turn may be substituted, $Z^1$ and $Z^2$ independently of one another, comprise a sulfur atom, a di$(C_1–C_4)$alkylmethylene group or an ethene-1,2-diyl group and A comprises a carbon atom or a chain having conjugated double bonds which results in the formation of a delocalized π-electron system between the quaternary nitrogen atom of the 3H-indolium, quinolinium or benzothiazolium radical and the enolate oxygen atom of the pyrimidine-2,4,6-trione radical.

2. A recording material as claimed in claim 1, wherein the cyanine dye having a betaine structure or having a betaine structure and containing an anion corresponds to a formula selected from the group consisting of formulae (II) to (IV)

(II)

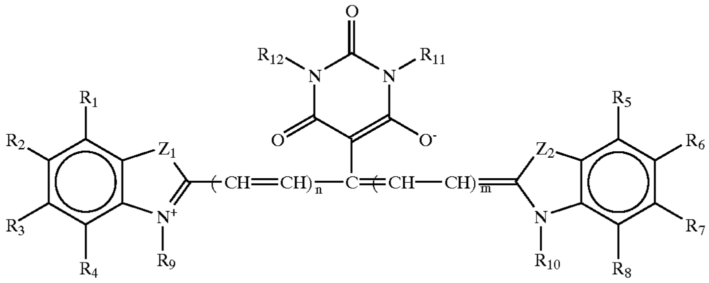

(III)

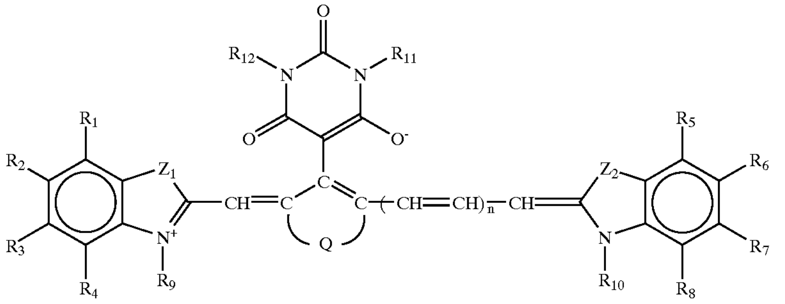

(IV)

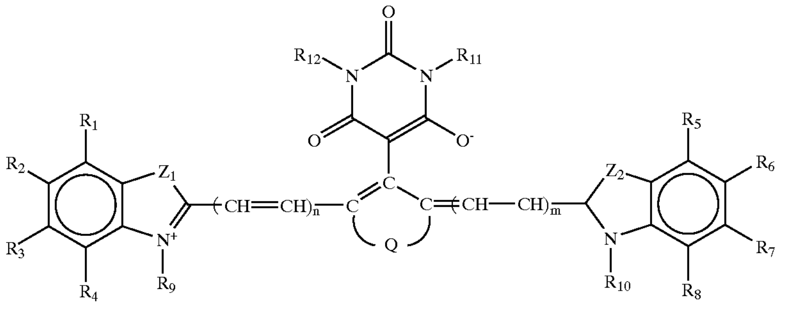

wherein n and m are integers from 1 to 8, with the proviso that n+m=2 or greater and Q are the members required for the formation of a 4- to 7-membered isocyclic or heterocyclic ring, and wherein the remaining variables are as set forth in claim 1.

3. A recording material as claimed in claim 2, wherein the ring formed with inclusion of Q is a ($C_4$–$C_7$)cycloalkene.

4. A recording material as claimed in claim 2, wherein the ring formed with inclusion of Q is a cyclopentene.

5. A recording material as claimed in claim 1, wherein the binder contains acidic groups having a $pK_a$ of less than 13.

6. A recording material as claimed in claim 5, wherein the binder is (i) a polycondensate of phenols or sulfamoyl- or carbamoyl-substituted aromatics with aldehydes or ketones, (ii) a reaction product of diisocyanates with diols or diamines or (iii) a polymer having units of vinylaromatics, N-aryl(meth)acrylamides or aryl (meth)acrylates, these units each furthermore optionally containing one or more carboxyl groups, phenolic hydroxyl groups, sulfamoyl groups or carbamoyl groups.

7. A recording material as claimed in claim 6, wherein the polycondensate is a novolak, the amount of novolak being at least 50% by weight based on the total weight of all binders in said organic polymeric binder layer.

8. A recording material as claimed in claim 1, wherein the amount of the binder is from 40 to 99.8% by weight, based on the total weight of nonvolatile components in said organic polymeric binder layer.

9. A recording material as claimed in claim 1, wherein the cyanine dye experiences no increase in solubility after a brief post-bake.

10. A recording material as claimed in claim 1, wherein the amount of the cyanine dye having a betaine structure or having a betaine structure and containing an anion and having the formula (I) is from 0.2 to 30% by weight, based on the total weight of solids in said dye layer.

11. A recording material as claimed in claim 1, wherein the dye layer comprises two or more different dyes for covering the near IR spectrum, each dye is a cyanine dye having a betaine structure or having a betaine structure and containing an anion of formula I.

12. A recording material as claimed in claim 1, further comprising a carbon black pigment in the dye which is optionally predispersed with a dispersant containing phenolic hydroxyl groups.

13. A recording material as claimed in claim 1, further comprising an overcoat comprising at least one water-soluble polymeric binder present on the organic polymeric binder layer or on the dye layer.

14. A recording material as claimed in claim 13, wherein the water-soluble polymeric binder comprises at least one of polyvinyl alcohol, polyvinylpyrrolidone, partially hydrolyzed polyvinyl acetate, gelatin, a carbohydrate or hydroxyethylcellulose.

15. A recording material as claimed in claim 1, wherein the substrate comprises an aluminum foil.

16. The recording material according to claim 1, wherein said substrate is a lithographic printing substrate.

17. A process for the production of a printing plate comprising:

exposing a radiation-sensitive recording material according to claim 14 imagewise to infrared radiation and then developing the exposed material in an aqueous alkaline solution.

* * * * *